(12) United States Patent
Hashimoto et al.

(10) Patent No.: US 7,479,317 B2
(45) Date of Patent: Jan. 20, 2009

(54) ADHESIVE SHEET ROLL FOR WAFER PROCESSING

(75) Inventors: Kouichi Hashimoto, Ibaraki (JP); Kazuhiko Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 127 days.

(21) Appl. No.: 11/054,826

(22) Filed: Feb. 10, 2005

(65) Prior Publication Data
US 2005/0191456 A1   Sep. 1, 2005

(30) Foreign Application Priority Data
Feb. 26, 2004   (JP) .............................. 2004-051902

(51) Int. Cl.
*B32B 9/00*   (2006.01)
*B32B 33/00*   (2006.01)
*D06N 7/04*   (2006.01)

(52) U.S. Cl. ..................... 428/40.1; 428/41.8; 428/141; 428/906

(58) Field of Classification Search ................ 428/41.8, 428/906, 40.1, 119, 141, 343
See application file for complete search history.

(56) References Cited

U.S. PATENT DOCUMENTS

| 4,447,485 A | * | 5/1984 | Aritake ...................... 428/144 |
| 4,987,214 A | * | 1/1991 | Kan et al. ................... 528/317 |
| 5,962,097 A | * | 10/1999 | Yamamoto et al. ......... 428/40.1 |
| 6,258,426 B1 | * | 7/2001 | Yamamoto et al. ......... 428/40.1 |
| 6,323,301 B1 | * | 11/2001 | Smith et al. ................. 528/125 |
| 7,029,550 B2 | * | 4/2006 | Kiuchi et al. ............ 156/272.2 |

FOREIGN PATENT DOCUMENTS

| JP | 60-223139 | 11/1985 |
| JP | 62-59684 | 3/1987 |
| JP | 2000-355678 A | 12/2000 |

* cited by examiner

*Primary Examiner*—Patricia L Nordmeyer
(74) *Attorney, Agent, or Firm*—Knobbe Martens Olson & Bear LLP

(57) ABSTRACT

An adhesive film in roll for wafer processing is constituted by laminated multiple layers including a base film, a radiation curing type adhesive layer, and a releasing film in this sequence, in which the arithmetic average roughness (Ra) of the side of the base film and/or releasing film opposite to the radiation curing type adhesive layer is 1 μm or more, and the weight of the radical polymerization initiator contained in the radiation curing type adhesive layer is less than 1000 ppm.

21 Claims, 1 Drawing Sheet

ADHESIVE SHEET ROLL FOR WAFER PROCESSING

BACKGROUND OF THE INVENTION

1. Field of the Invention

The present invention relates to an adhesive sheet roll for wafer processing, an adhesive sheet for wafer processing, and an adhesive sheet with semiconductor wafer. The present invention also relates to a manufacturing method of a semiconductor device using an adhesive sheet for wafer processing or an adhesive sheet with semiconductor wafer, and a semiconductor device obtained by this manufacturing method. The adhesive sheet roll for wafer processing of the invention is useful as adhesive sheet used for protecting the wafer surface in the grinding process for grinding the rear side of the semiconductor wafer in the manufacturing process of various semiconductors, or adhesive sheet for fixing and supporting for adhering to the reverse side of the wafer in the dicing process for automatically collecting small pieces by pickup method by cutting and dividing the semiconductor wafer into small pieces.

2. Description of the Related Art

In the wafer manufacturing process, generally, the wafer forming a pattern is ground to a specified thickness by back grinding process. At this time, for the purpose of protecting the wafer, generally, the wafer surface is ground by adhering an adhesive sheet as wafer adhesive sheet. When cutting the wafer into individual chips, generally, the wafer surface is diced by adhering an adhesive sheet as wafer protective sheet.

Recently, the wafer is becoming larger in size such as 8 inches or 12 inches, and the wafer is becoming thinner for use in IC card or the like. The adhesive sheet used in such processing is required to be peeled easily after processing the semiconductor wafer, it is proposed to use an adhesive sheet having a radiation curing type adhesive layer capable of lowering the adhesion of the adhesive layer by irradiation with ultraviolet ray or the like. When this radiation curing type adhesive sheet is irradiated with radiation such as ultraviolet ray, the adhesive layer is cured and shrinks, and the adhesion with the semiconductor wafer at the adherent side is lowered.

A radiation curing type adhesive is composed of essential materials including base polymer, radiation polymerizable compound (monomer, oligomer) having carbon-carbon double bond in the molecule with the weight-average molecular weight of 20000 or less, and radiation polymerization initiator, and is prepared by adding proper additives such as crosslinking agent and others. Such adhesive is extremely lowered in the adhesion after exposure to radiation, and a multifunctional compound having two or more carbon-carbon double bonds in molecule is used as radiation polymerizable compound (Japanese unexamined patent publication 60-223139 and Japanese unexamined patent publication 62-059684).

By preparing a radiation reactive polymer by introducing carbon-carbon double bond in the main chain or side chain of base polymer, a technology not using radiation polymerizable compound having two or more carbon-carbon double bonds has been also disclosed (Japanese unexamined patent publication 2000-355678).

It has been a problem, however, for such adhesives of wafer processing adhesive sheets that the reaction progresses gradually during storage from manufacture until use because of the reactive property until the adhesive sheets are cured completely at the time of use. Such phenomenon is caused by gradual progress of radical polymerization chain reaction due to photopolymerization initiator contained in the adhesive composition or residual thermopolymerization initiator used when synthesizing the base polymer.

To suppress such polymerization reaction during storage, it has been proposed to add an additive for inactivating the radical chain reaction such as polymerization inhibitor or antioxidant in the adhesive composition.

However, the polymerization inhibitor or antioxidant is not effective unless contained by a certain amount in the adhesive composition, but if contained too much, the adhesive may not react to cure when using the adhesive sheet, or the paste may be left over on the wafer due to insufficient reaction. Further, if such additives bleed out, the semiconductor wafer itself may be contaminated.

SUMMARY OF THE INVENTION

It is hence an object of the invention to present an adhesive sheet roll for wafer processing excellent in storage stability, radiation curing property, and low contamination of wafer. It is also an object of the invention to present adhesive sheet for wafer processing formed by cutting the adhesive sheet roll for wafer processing, and adhesive sheet with semiconductor wafer. It is a further object of the invention to present a manufacturing method of semiconductor device using adhesive sheet for wafer processing or adhesive sheet with semiconductor wafer, and a semiconductor device obtained by this manufacturing method.

The present inventors have intensively studied to solve the problems, and found that the objects can be achieved by using the adhesive sheet for wafer processing described below, and finally completed the invention.

That is, the invention relates to an adhesive sheet roll for wafer processing which winding multiple layers of laminated film stacking up base film, radiation curing type adhesive layer, and releasing film in this sequence, in which the arithmetic average roughness (Ra) of the other surface of the side of the base film and/or releasing film contacting with the radiation curing type adhesive layer is 1 μm or more, and the weight of the radical polymerization inhibitor contained in the radiation curing type adhesive layer is less than 1000 ppm.

The present inventors have found that the radical polymerization chain reaction can be effectively suppressed even if the amount of the radical polymerization inhibitor contained in the radiation curing type adhesive layer is extremely small by defining the arithmetic average roughness (Ra) of the other surface of the side of the base film and/or releasing film of the laminated film of the above composition contacting with the radiation curing type adhesive layer at 1 μm or more, and storing the laminated film by winding in a roll, and have discovered that the adhesive sheet roll for wafer processing excellent in storage stability can be obtained. The adhesive layer of the adhesive sheet of the invention is extremely small in the content of the radical polymerization inhibitor, and failure of reactive curing of the adhesive when using the adhesive sheet, or residue of paste on the wafer due to lack of reaction can be avoided. The reason of such prominent effect is not clear, but when a laminated film stacking up base film, radiation curing type adhesive layer, and releasing film in this sequence is wound in a roll in multiple layers, usually, the base film and releasing film contact tightly with each other. By roughening the other surface of the side of the base film and/or releasing film contacting with the radiation curing type adhesive layer, an air layer is formed between the two films, and the oxygen contained in the air seems to effectively impede the radical polymerization reaction of the adhesive by penetrating through the films. Meanwhile, the side of the base film or releasing film contacting with the radiation curing type adhesive layer is not roughened because the adhesive layer is very soft, and if the side contacting with the adhesive layer is roughened, the adhesive gradually absorbs the undulations, and formation of air layer cannot be maintained.

Preferably, the arithmetic average roughness (Ra) of the other surface of the side of the base film and/or releasing film contacting with the radiation curing type adhesive layer is 1.5 μm or more, further preferably 2 μm or more. If the arithmetic average roughness (Ra) of the film surface is less than 1 μm, air layer is not formed sufficiently between the base film and releasing film, and flow of air (oxygen) decreases to form a sealed state, and the radical polymerization reaction during storage cannot be impeded effectively.

The weight of the radical polymerization inhibitor contained in the radiation curing type adhesive layer is preferred to be less than 800 ppm, and more preferably less than 600 ppm. If the weight of the radical polymerization inhibitor is 1000 ppm or more, the polymerization inhibiting action is extreme, and radiation polymerization reaction when using an adhesive sheet is impeded, and the characteristic of the radiation curing adhesive layer tends to be lost. If the weight is too small, stability tends to drop at high temperature or in long-term storage, and hence it is preferred to be more than 10 ppm, or more preferably more than 50 ppm.

In the invention, the ten-point average roughness (Rz) of the other surface of the side of the base film and/or releasing film contacting with the radiation curing type adhesive layer is preferred to be 8 μm or more, further preferably 10 μm or more, or particularly 12 μm or more. When the ten-point average roughness (Rz) of the film surface is 8 μm or more, the radical polymerization reaction during storage can be more effectively impeded.

The invention relates to an adhesive sheet roll for wafer processing which winding multiple layers of laminated film stacking up base film, radiation curing type adhesive layer, and releasing film in this sequence, and in this adhesive sheet roll for wafer processing, a set-off film is laminated on the other side of the base film or releasing film contacting with the radiation curing type adhesive layer, and the arithmetic average roughness (Ra) of the surface of one side or both sides of the set-off film is 1 μm or more, and the weight of the radical polymerization inhibitor contained in the radiation curing type adhesive layer is less than 1000 ppm.

Thus, instead of roughening the other surface of the side of the base film and/or releasing film contacting with the radiation curing type adhesive layer, by using a set-off film, the arithmetic average roughness (Ra) of the surface of one side or both sides of the set-off film may be set to 1 μm or more. For inspection of appearance of adhesive sheet and surface inspection of wafer after adhering the adhesive sheet, transparency of adhesive sheet is required, but if the surface is rough in the base film or releasing film, transparency tends to be poor. Accordingly, by using a set-off film, an air layer can be formed between films without roughening the surface of the base film or releasing film. When using the adhesive sheet, by peeling off the set-off film, the appearance can be inspected easily.

The arithmetic average roughness (Ra) of the surface of one side or both sides of the set-off film is preferred to be 1.5 μm or more, or more preferably 2 μm or more. If the arithmetic average roughness (Ra) of the surface of the set-off film is less than 1 μm, air layer is not formed sufficiently between the base film and releasing film, and flow of air (oxygen) decreases to form a sealed state, and the radical polymerization reaction during storage cannot be impeded effectively.

The weight of the radical polymerization inhibitor contained in the radiation curing type adhesive layer is preferred to be less than 800 ppm same as specified above, and more preferably less than 600 ppm.

The ten-point average roughness (Rz) of the surface of one side or both sides of the set-off film is preferred to be 8 μm or more, further preferably 10 μm or more, or particularly 12 μm or more. If the ten-point average roughness (Rz) of the surface of the set-off film is more than 8 μm, the radical polymerization reaction during storage can be impeded more effectively.

The arithmetic average roughness (Ra) and ten-point average roughness (Rz) are numerical values calculated according to JIS B 0601-1994, and details are described in the embodiments.

The adhesive sheet for wafer processing of the invention is formed by cutting the adhesive sheet roll for wafer processing according to the shape of the semiconductor wafer. However, not required to cut precisely according to the shape of the semiconductor wafer, it can be adjusted properly depending on the purpose of use.

The invention relates to a method of manufacturing adhesive sheet with semiconductor wafer comprising a step of adhering a semiconductor wafer to a radiation curing type adhesive layer of the adhesive sheet roll for wafer processing, and a step of cutting the adhesive sheet according to the shape of the semiconductor wafer, and an adhesive sheet with semiconductor wafer manufactured by this method. Same as stated above, not required to cut precisely according to the shape of the semiconductor wafer, it can be adjusted properly depending on the purpose of use.

The invention further relates to a manufacturing method of semiconductor device characterized by processing the semiconductor wafer in a state of the radiation curing type adhesive layer of the adhesive sheet for wafer processing being adhered to the semiconductor wafer.

The invention also relates to a manufacturing method of semiconductor device characterized by processing the semiconductor wafer of the adhesive sheet with semiconductor wafer.

The invention moreover relates to a semiconductor device manufactured in such method.

DESCRIPTION OF THE PREFERRED EMBODIMENTS

Figure 1:
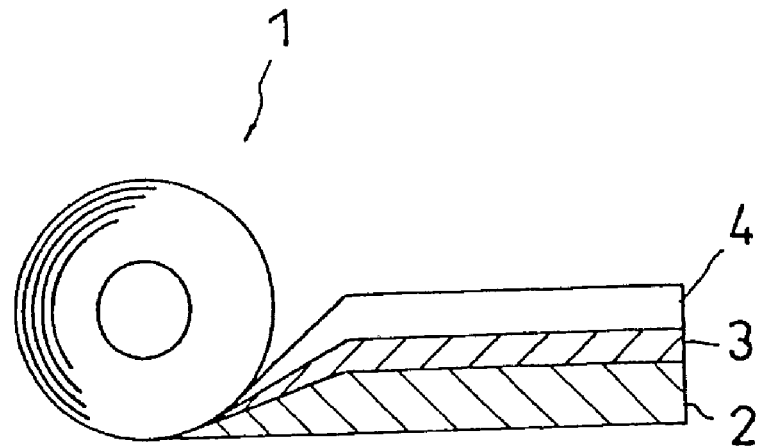
FIG. 1 is a schematic view showing composition of adhesive sheet roll for wafer processing of the invention.

As shown in FIG. 1, an adhesive sheet roll for wafer processing 1 of the invention is a laminated film stacking up a base film 2, a radiation curing type adhesive layer 3, and a releasing film 4 in this sequence, being wound in multiple layers in a tape form. For the convenience of use, a long adhesive sheet extending about tens to hundreds of meters rolled in a cylindrical tube is preferred.

The material of base film is not limited, and any material used in adhesive sheet for wafer processing may be used, and in consideration of radiation curing of the adhesive layer, a material passing at least part of radiation such as X-ray, ultraviolet ray or electron ray is used. The examples of such materials include polyolefines such as low density polyethylene, linear polyethylene, medium density polyethylene, high density polyethylene, ultra low density polyethylene, random copolymer polypropylene, block copolymer polypropylene, homopolypropylene, polybutene, and poly(methylpentene); ethylene-vinyl acetate copolymer, ionomer resin, ethylene-(meth)acrylic acid copolymer, ethylene-(meth)acrylate ester (random or alternating) copolymer, ethylene-butyne copolymer, ethylene-hexene copolymer, polyurethane, polyesters such as polyethylene terephthalate, polyimide, polyetherketone, polystyrene, poly(vinyl chloride), poly(vinylidene chloride), fluororesin, silicone resin, cellulose resin, and other polymers such as crosslinked products thereof. As the base film, same or different materials maybe properly selected and used, and several types may be blended as required.

The base film may be non-oriented film or uniaxially or biaxially oriented film as needed. If desired, the surface of the base film produced by such a process may be subjected to any conventional physical or chemical treatment such as mat treatment, corona discharge treatment, primer treatment, and crosslinking treatment (chemical crosslinking (silane)). A thickness of the base film is generally about 10 to 400 μm, preferably about 30 to 250 μm.

The radiation curing type adhesive used in formation of radiation curing type adhesive layer includes, for example, additive adhesives (blend type) of general pressure sensitive adhesives such as acrylic adhesive or rubber adhesive, blended with radiation curing type monomer components or oligomer components. In particular, from the viewpoint of adhesion to semiconductor wafer or respective base films and ease of molecular design, an acrylic adhesive using acrylic polymer as base polymer is preferred. As radiation curing type adhesive, in particular, an adhesive lowered in adhesion by irradiation of ultraviolet ray is preferred.

Monomer components for forming the acrylic polymer include (meth)acrylic acid alkyl ester (for example, methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethyl hexyl ester, iso-octyl ester, nonyl ester, decyl ester, isodecyl ester, undecyl ester, dodecyl ester, tridecyl ester, tetradecyl ester, hexadecyl ester, octadecyl ester, eicosyl ester, other alkyl radicals with 1 to 30 carbon atoms, straight chain or branch chain alkyl ester with 4 to 18 carbon atoms), and (meth) acrylic cycloalkyl ester (for example, cyclopentyl ester, cyclohexyl ester). These materials may be used either alone or in combination of two or more types. Herein, (meth)acrylate refers to acrylate and/or methacrylate, and (meth) is meant the same throughout the description of the present invention.

The acrylic polymer may be contained by the units corresponding to the monomer components and copolymerizable other monomer components, as required, for the purpose of improving the cohesion and heat resistance. Such monomer components include, for example, acrylic acid, methacrylic acid, carboxyethyl(meth)acrylate, carboxypentyl(meth)acrylate, itaconic acid, maleic acid, fumaric acid, crotonic acid, other monomers containing carboxyl radicals; maleic anhydride, itaconic anhydride, other anhydrous monomers; (meth) acrylic acid 2-hydroxy ethyl, (meth)acrylic acid 2-hydroxy propyl, (meth)acrylic acid 4-hydroxy butyl, (meth)acrylic acid 6-hydroxy hexyl, (meth)acrylic acid 8-hydroxy octyl, (meth)acrylic acid 10-hydroxy decyl, (meth)acrylic acid 12-hydroxy lauryl, (4-hydroxy methyl cyclohexyl)methyl (meth)acrylate, other monomers containing hydroxyl radicals; styrenesulfonic acid, acryl sulfonate, 2-(meth)acrylamide-2-methyl propane sulfonic acid, (meth)acrylamide propane sulfonic acid, sulfopropyl(meth)acrylate, (met)acryloyl oxy naphthalene sulfonic acid, other monomers containing sulfonic radicals; 2-hydroxy ethyl acryloyl phosphate, other monomers containing phosphoric radicals; acrylamide, acrylonitrile, etc. These copolymerizable monomer components may be used either alone or in combination of two or more types. The amount of such copolymerizable monomers is preferred to be 40 wt. % or less of the total monomer components.

The acrylic polymer may containing multifunctional monomers, for crosslinking purpose, as monomer components for copolymerization as required. Such multifunctional monomers include, for example, hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri (meth)acrylate, pentaerythritol tri(meth)acrylate, dipentaerythritol hexa(meth)acrylate, epoxy(meth)acrylate, polyester(meth)acrylate, urethane(meth)acrylate, etc. These multifunctional monomers may be also used either alone or in combination of two or more types. The amount of the multifunctional monomers is preferred to be 30 wt. % or less of the total monomer components from the viewpoint of adhesive property, etc.

The acrylic polymer is obtained by polymerizing a single monomer or mixture of two or more monomers. Methods of polymerization include solution polymerization, emulsification polymerization, block polymerization, and suspension polymerization. The adhesive layer is preferred to be small in the content of low molecular component as mentioned above from the viewpoint of prevention of contamination of semiconductor wafer. Hence, the weight-average molecular weight of acrylic polymer is preferably 100,000 to 2,000,000, further preferably 300,000 to 1,200,000 approximately.

The base polymer may be either one type or mixture of two or more types, but when two or more types are mixed, the content of low molecular components of molecular weight of 100,000 or less should be adjusted to be 15 wt. % or less.

An external crosslinking agent may be added to the adhesive agent. Specific means of external crosslinking method includes a method of reaction by adding a so-called crosslinking agent such as polyisocyanate compound, epoxy compound, aziridine compound, or melamine crosslinking agent. When using an external crosslinking agent, its amount is determined properly in balance with the base polymer to be crosslinked, and purpose of use of the adhesive. Generally, it is preferred to blend about 1 to 5 parts by weight in 100 parts by weight of the base polymer. Aside from such components, other additives may be added to the adhesive as required, such as known tackifier and antioxidant.

Monomer components of radiation curing type to be blended in the adhesive include, for example, urethane oligomer, urethane(meth)acrylate, trimethylol propane tri(meth) acrylate, tetramethylol methane tetra(meth)acrylate, pentaerythritol tri(meth)acrylate, pentaerythritol tetra(meth) acrylate, dipentaerythritol monohydroxy penta(meth) acrylate, dipentaerythritol hexa(meth)acrylate, 1,4-butane diol di(meth)acrylate, and others. Radiation curing oligomer components include various oligomers of, for example, urethane type, polyether type, polyester type, polycarbonate type, and polybutadiene type, and the component of molecular weight of about 100 to 30000 is preferred. The blending amount of radiation curing monomer component or oligomer component may be properly determined to lower the adhesive force of the adhesive layer depending on the type of the adhesive layer. Generally, in 100 parts by weight of the base polymer such as acrylic polymer composing the adhesive agent, it is preferred to add by 0.1 to 200 parts by weight, more preferably 0.1 to 150 parts by weight.

As the radiation curing type adhesive, aside from the additive type radiation curing type adhesive mentioned above, it is also preferred to use an inclusive type radiation curing type adhesive (adduct type) using as the base polymer having carbon-carbon double bond in the polymer side chain, principal chain, or principal chain end. The inclusive type radiation curing type adhesive is preferred because the oligomer component of low molecular weight is not needed or contained only slightly, and the oligomer component does not moved in the adhesive in the course of time, so that an adhesive layer of stable layer structure can be formed.

The base polymer having carbon-carbon double bond is not particularly limited as far as it has carbon-carbon double bond and is adhesive. As such base polymer, an acrylic polymer is preferred to have a basic skeleton. The basis skeleton of acrylic polymer includes the acrylic polymers mentioned above.

The method of introducing the carbon-carbon double bond into the acrylic polymer is not particularly specified, and various methods are possible, but for the ease of molecular design, preferably, the carbon-carbon double bond should be introduced to the polymer side chain. For example, after preliminarily copolymerizing a monomer having a functional group to the acrylic polymer, a compound having functional group capable of reacting with this functional group and carbon-carbon double bond is condensed or added to perform reaction while maintaining the radiation curing property of the carbon-carbon double bond.

Combination examples of functional groups include carboxy radical and epoxy radical, carboxy radical and aziridyl radical, and hydroxyl radical and isocyanate radical. Among these combinations of functional groups, the combination of hydroxyl radical and isocyanate radical is preferred from the viewpoint of ease of tracing the reaction. By such combination of functional groups, as far as acrylic polymer having carbon-carbon double bond is produced, the functional groups may be placed at either side of acrylic polymer and compound, but among the preferred combinations, the acrylic polymer should have a hydroxyl radical, and the compound should have an isocyanate radical. In this case, the isocyanate compound having carbon-carbon double bond includes, for example, methacryloyl isocyanate, 2-methacryloyl oxyethyl isocyanate, and m-isopropenyl-α,α-dimethyl benzyl isocyanate. The acrylic polymer includes the monomer containing hydroxyl radical mentioned above, and other copolymers with 2-hydroxy ethyl vinyl ether, 4-hydroxy butylvinyl ether, diethylene glycol monovinyl ether, and other ether compounds.

As the inclusive radiation curing type adhesive, a base polymer (in particular, acrylic polymer) having carbon-carbon double bond may be used alone, but the radiation curing monomer components or oligomer components may be blended by such an extent not to worsen the characteristics. The radiation curing oligomer component may be added by 200 parts by weight or less, preferably 100 parts by weight or less in 100 parts by weight of the base polymer.

The radiation curing type adhesive should contain a photopolymerization initiator when curing by ultraviolet ray or the like. Examples of photopolymerization initiator include 4-(2-hydroxy ethoxy)phenyl(2-hydroxy-2-propyl)ketone, α-hydroxy-α, α'-dimethyl acetophenone, 2-methyl-2-hydroxypropiophenone, 1-hydroxy cyclohexyl phenyl ketone, other α-ketol compounds; methoxy acetophenone, 2,2-dimethoxy-2-phenyl acetophenone, 2,2-diethoxy acetophenone, 2-methyl-1-[4-(methylthio)-phenyl]-2-morpholino-propane-1, other acetophenone compounds; benzoin ethyl ether, benzoin isopropylether, anizoin methyl ether, other benzoin ether compounds; benzyl dimethyl ketal, other ketal compounds; 2-naphthalene sulfonyl chloride, other aromatic sulfonyl chloride compounds; 1-phenone-1,1-propanedione-2-(o-ethoxy carbonyl)oxime, other photoactive oxime compounds; benzophenone, benzoyl benzoic acid, 3,3'-dimethyl-4-methoxybenzophenone, other benzophenone compounds; thioxanthone, 2-chlorothioxanthone, 2-methyl thioxanthone, 2,4-dimethyl thioxanthone, isopropyl thioxanthone, 2,4-dichlorothoixanthone, 2,4-diethyl thioxanthone, 2,4-diisopropyl thioxanthone, other thioxanthone compounds; campher quinine; ketone halide; acyl phosphino oxide; and acyl phosphoanate, etc. The content of photopolymerization initiator is preferred to be about 1 to 10 parts by weight in 100 parts by weight of base polymer such as (meth)acrylic polymer for composing the adhesive agent, more preferably about 3 to 5 parts by weight.

The radical polymerization inhibitor to be added to the radiation curing type adhesive is not particularly limited as far as required effects are expressed, such as phenol type, amine type, phosphorus type, and sulfur type, but the phenol type is particularly preferred. Examples include hydroquinone, methoquinone (MEHQ: hydroquinone monomethyl ether), p-benzoquinone, phenothiazine, mono-t-butyl hydroquinone, catechol, p-t-butyl catechol, benzoquinone, 2,5-di-t-butyl hydroquinone, asothraquinone, and 2,6-di-t-butyl hydroxy toluene (BHT).

The crosslinking agent, photopolymerization initiator, radiation curing monomer components and oligomer components, and other additives are low molecular components, but are materials capable of reacting with polymers, and after reaction, they are taken in as part of polymer chain, and hence do not produce transfer pollutants.

The thickness of the radiation curing type adhesive layer is not particularly specified, but usually it is about 1 to 300 µm, preferably 3 to 200 µm, or more preferably 5 to 100 µm.

The material for forming the releasing film is a synthetic resin film of polyethylene, polypropylene, polytetrafluoroethylene, polyethylene terephthalate, etc. The surface of the releasing film may be properly treated for enhancing the peeling properly from the adhesive layer as required by, for example, silicone treatment, long chain alkyl treatment, fluorine treatment, or other parting treatment. The thickness of the releasing film is usually 10 to 200 µm, preferably about 25 to 100 µm.

The method of defining the arithmetic average roughness (Ra) of the other surface of the side of the base film and/or releasing film contacting with the radiation curing type adhesive layer at 1 µm or more, and the ten-point average roughness (Rz) at 8 µm or more includes various methods, such as a method of heating, extruding and forming the film, and immediately contacting with a metal roll having fine undulations, a method of spraying sand to contact with the formed film (sand blasting method), and a method of etching the formed film by alkaline solution.

The adhesive sheet roll for wafer processing of the invention may be manufactured by, for example, forming an adhesive layer on a base film, and adhering a releasing film to the adhesive layer. The forming method of adhesive layer is not particularly specified, including a method of forming by directly applying an adhesive to the base film, and a method of forming an adhesive layer on a releasing film first, and then adhering them to the base film. A long adhesive sheet is wound in multiple layers on a cylindrical tube to form a roll. When winding, either the base film may be wound on the inner side, or the releasing film may be wound on the inner side.

Figure 2:
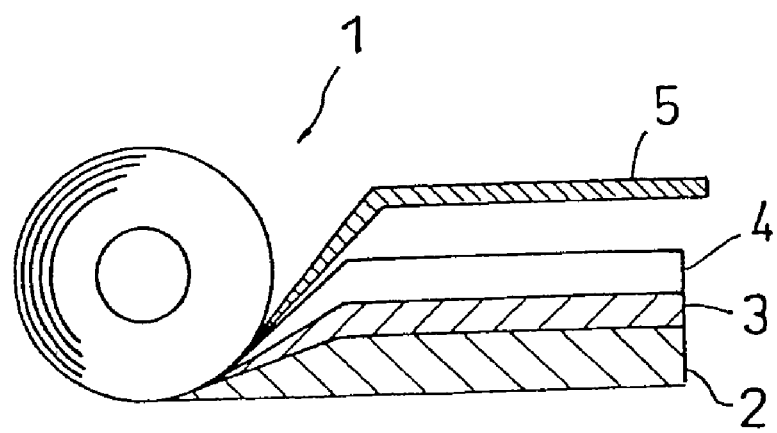
FIG. 2 is a schematic view showing other composition of adhesive sheet roll for wafer processing of the invention.

As shown in FIG. 2, the adhesive sheet roll for wafer processing 1 of the invention is a laminated film stacking up at least a base film 2, a radiation curing type adhesive layer 3, and a releasing film 4 in this sequence, and a set-off film 5 may be laminated on the other side of the base film 2 or releasing film 4 contacting with the radiation curing type adhesive layer 3, thereby winding in multiple layers to form into a tape.

The forming material of the set-off film is not particularly specified, and includes, for example, polyethylene terephthalate, polybutylene terephthalate, polyethylene naphthalate, other polyester film, biaxially drawn polypropylene, low density polyethylene, other polyolefin film, and multilayer films including these films. The thickness is preferably 8 to 100 μm, more preferably 10 to 40 μm. If the thickness is less than 8 μm, in the process of winding the laminated film, wrinkles are likely to be formed when inserting the set-off film into the winding portion, and the tape appearance tends to be poor. On the other hand, when the thickness exceeds 100 μm, the roll size of the adhesive sheet roll for wafer processing is larger, and the cost is higher for transportation and refuse disposal.

As the method of defining the arithmetic average roughness (Ra) of the surface of one side or both sides of the set-off film at 1 μm or more, and the ten-point average roughness (Rz) at 8 μm or more, the methods described above may be employed. The surface of the base film and/or releasing film contacting with the set-off film may be either smooth or rough.

The method of fabricating an adhesive sheet roll for wafer processing having a set-off film of the invention is characterized, for example, by forming an adhesive layer on a base film or releasing film, and laminating the releasing film or base film on the adhesive layer to compose a laminated film. The process is then followed by 1) a method of laminating a set-off film on other side of base film or releasing film, and winding the long formed adhesive sheet in multiple layers on a cylindrical tube to form a roll, 2) a method of winding by inserting a set-off film between the base film and releasing film when winding the laminated film in a roll, 3) a method of winding the laminated film in a roll, and rewinding to insert and wind the set-off film between the base film and releasing film, or 4) a method of cutting the laminated film into a product size, and winding the set-off film while enclosing after cutting off. To inspect for foreign matter in the adhesive sheet roll for wafer processing, the method of 4) is more preferable, and when winding, the set-off film may be wound on the inner side or the set-off film may be wound on the outer side.

The adhesive sheet roll for wafer processing of the invention is a long continuous roll form taken up in a length of 1 to 500 m preferably from the viewpoint of working efficiency of use, more preferably 10 to 200 m, particularly preferably 20 to 100 m. Thus, by roughening the surface of the specified film, air (oxygen) invades into the space between the base film and the releasing film when taking up continuously in a roll. The invading oxygen further permeates into the adhesive layer by passing through the base film and releasing film, and suppresses the radical polymerization reaction, so that the polymerization reaction in transportation and storage can be effective suppressed if the amount of polymerization inhibitor is only a trace.

The adhesive sheet roll for wafer processing of the invention is formed into a label of adhesive sheet for wafer processing by cutting (blanking) into a shape suited to the application. For example, in the manufacturing process of semiconductors, it can be used as adhesive sheet used for protecting the surface of wafer in the grinding process of grinding the back surface of semiconductor wafer, or as adhesive sheet for fixing and supporting to be adhered to the back surface of wafer in the dicing process for automatically collecting small pieces by pickup system by cutting and dividing the semiconductor wafer into small pieces.

The adhesive sheet roll for wafer processing may be rewound, and the semiconductor wafer may be adhered to the radiation curing type adhesive layer of the rewound adhesive sheet, and then the adhesive sheet may be cut according to the shape of the semiconductor wafer, and an adhesive sheet with semiconductor wafer may be formed.

The adhesive force of the adhesive layer may be determined properly depending on the purpose of use, but generally it is determined by the adhesion maintenance property to the semiconductor wafer or the peeling performance from the wafer. When fixing and protecting the wafer, the 180-degree peel adhesion (23° C., tensile speed 300 mm/min) before exposure to radiation is preferred to be 1 N/20 mm tape width or more. On the other hand, when peeling the adhesive sheet from the wafer, ease of peeling is preferred. For example, the 180-degree peel adhesion of the adhesive layer after exposure to radiation is preferred to be adjusted to 0.5 N/20 mm or less.

The adhesive sheet for wafer processing of the invention is used in ordinary method. To adhere the adhesive sheet to the pattern surface of the semiconductor wafer, the semiconductor wafer is placed on the table so that the pattern side may be upward, and the adhesive layer of the adhesive sheet is overlaid on the pattern surface, and it is adhered by pressing by using pressing means such as adhering roll. Or, in a pressurizing container (for example, autoclave), the semiconductor wafer and adhesive sheet are overlaid as mentioned above, and adhered to the wafer by pressurizing the container. At this time, it is also possible to adhere by pressing by pressurizing means. It is also possible to adhere similarly in a vacuum chamber. The adhering method is not particularly limited, and when adhering, it is also possible to heat below the melting point of the base film.

For thin processing, for example, an ordinary method may be employed. As thin processing machine, a grinder (back grinder) or CMP pad may be used. Thin processing is executed until the semiconductor wafer is machined to a desired thickness. After thin processing, the adhesive sheet is peeled off from the semiconductor, and it is peeled off by lowering the adhesion by emitting radiation to the radiation curing type adhesive layer. Means of emitting radiation is not particularly specified, but it may be realized, for example, by ultraviolet radiation.

EXAMPLES

The invention is described below by referring to preferred examples, but it must be noted that the invention is not limited to the examples alone.

<Measurement of Arithmetic Average Roughness (Ra) and Ten-point Average Roughness (Rz)>

Conforming to JIS B 0601-1994, the roughness was measured in the following condition by using superdepth measuring microscope (VK-8510 Series of KEYENCE CORPORATION).

| | |
|---|---|
| Magnification: | 1000 times |
| Measuring mode: | Color superdepth measurement |
| Measuring (scanning) distance: | 13 to 20 μm |
| Scan pitch: | 0.02 μm |
| Laser gain: | Automatic |
| Laser sensitivity: | Gamma 1 |

<Measurement of Adhesion Power>

The manufactured adhesive sheet roll for wafer processing before storage was cut to a size of silicon mirror wafer, and a label of adhesive sheet for wafer processing was fabricated.

The releasing film (together with set-off film if necessary) was peeled off from the adhesive sheet for wafer processing, and the adhesive layer was adhered to the silicon mirror wafer. Using Tensilon RTM-100 of ORIENTEC Co., LTD, the adhesion force of the adhesive layer before radiation curing was measured. Further, ultraviolet ray was emitted to the adhesive layer in the following condition, and the adhesive force of the adhesion layer after radiation curing was similarly measured.

The manufactured adhesive sheet roll for wafer processing was stored for 300 hours in the condition of 50° C. and humidity of 60%, and an adhesive sheet was cut off from the inside portion of 50 m from the starting end of the adhesive sheet roll for wafer processing. Same as mentioned above, the adhesive layer was adhered to the silicon mirror wafer, and the adhesion force of the adhesive layer before radiation curing was measured. Further emitting the ultraviolet ray to the adhesive layer in the following condition, the adhesive force of the adhesive layer after radiation curing was similarly measured.

| Measuring temperature, humidity: | 23° C., 60% |
|---|---|
| Peel angle: | 180 degrees |
| Peel speed: | 300 mm/min |

Ultraviolet (UV) emission apparatus: NEL UM 810 of NITTO SEIKI INC.
Cumulative exposure of ultraviolet ray: 500 mJ/cm$^2$.

Example 1

(Preparation of Laminated Film)
A blended composition of 100 parts by weight of ethyl acrylate (MEHQ concentration: 100 ppm), 25 parts by weight of 2-hydroxy ethyl acrylate (MEHQ concentration: 300 ppm), and 0.2 part by weight of benzoyl peroxide as polymerization initiator was dissolved in toluene to concentration of 40 wt. %, and was copolymerized for 6 hours in nitrogen atmosphere at 60° C., and an acrylic copolymerization polymer solution was obtained. In 100 parts by weight of this acrylic copolymerization polymer, 20 parts by weight of 2-methacryloyl oxyethyl isocynate (BHT concentration: 400 ppm) was added to react for 12 hours at 50° C. in the presence of 0.1 part by weight of organic tin solvent (dibutyl tin dilaurate), and carbon-carbon double bond was introduced into the side chain of polymer molecule, and a radiation curing type polymer solution was obtained. The total residual concentration of polymerization inhibitor (BHT+MEHQ) in the radiation curing type polymer (solid content) was 50 ppm (these polymerization inhibitors were contained in the material monomer). In 100 parts by weight of polymer (solid content), 1 part by weight of polyisocyanate crosslinking agent (Coronate L of NIPPON POLYURETHANE INDUSTRY CO., LTD.), and 2.5 parts by weight of photopolymerization initiator (Irgacure 651 of Ciba Specialty Chemicals K.K.) were mixed in a solution, and an adhesive composition was obtained. By adding 2,6-di-t-butyl hydroxy toluene (BHT) until the total concentration of polymerization inhibitors in the solid content of the adhesive composition became 100 ppm, a radiation curing type adhesive was obtained.

The radiation curing type adhesive was applied to other surface of the base film (PET, thickness 50 μm) adjusted to arithmetic average roughness (Ra) of 1.6 μm and ten-point average roughness (Rz) of 15.0 μm by preliminary sand blasting, and a radiation curing type adhesive layer (thickness 30 μm) was formed by drying. Further, other side (treated for peeling) of releasing film (PET, thickness 38 μm) of arithmetic average roughness (Ra) of 0.3 μm and ten-point average roughness (Rz) of 5.0 μm at one side was adhered to the adhesive layer, and a laminated film was manufactured.

(Preparation of Adhesive Sheet Roll for Wafer Processing)
A cutting blade was inserted into the laminated film of 300 mm in width to a width of 230 mm, and the both ends of the laminated film was cut off while taking up on a winding core of ABS resin of 75 mm in diameter, and an adhesive sheet roll for wafer processing was prepared. The winding length of the adhesive sheet was 100 m.

Example 2

(Preparation of Laminated Film)
A blended composition of 30 parts by weight of ethyl acrylate (MEHQ concentration: 100 ppm), 70 parts by weight of 2-ethyl hexyl acrylate (MEHQ concentration: 100 ppm), 10 parts by weight of acrylic acid, and 0.2 part by weight of benzoyl peroxide as polymerization initiator was dissolved in ethyl acetate to concentration of 35 wt. %, and was copolymerized for 6 hours in nitrogen atmosphere at 60° C., and an acrylic copolymerization polymer solution was obtained. In 100 parts by weight of this acrylic copolymerization polymer, 100 parts by weight of dipentaerythritol hexa-acrylate (MEHQ concentration: 500 ppm) was added in solution. In the solid content of the solution, the concentration of the polymerization inhibitor (MEHQ) was 270 ppm. Further, in 100 parts by weight of the acrylic copolymerization polymer, 0.1 part by weight of epoxy crosslinking agent (Tetrad C of MITSUBISHI GAS CHEMICAL COMPANY. INC), and 2.5 parts by weight of photopolymerization initiator (Irgacure 651 of Ciba Specialty Chemicals K.K.) were mixed in a solution, and an adhesive composition was obtained. By adding 2,6-di-t-butyl hydroxy toluene (BHT) until the total concentration of polymerization inhibitors in the solid content of the adhesive composition became 500 ppm, a radiation curing type adhesive was obtained.

The radiation curing type adhesive was applied to other surface of the base film (PET, thickness 50 μm) adjusted to arithmetic average roughness (Ra) of 2.6 μm and ten-point average roughness (Rz) of 16.0 μm by preliminary sand blasting, and a radiation curing type adhesive layer (thickness 30 μm) was formed by drying. Further, other side (treated for peeling) of releasing film (PET, thickness 38 μm) of arithmetic average roughness (Ra) of 0.3 μm and ten-point average roughness (Rz) of 5.0 μm at one side was adhered to the adhesive layer, and a laminated film was manufactured.

(Preparation of Adhesive Sheet Roll for Wafer Processing)
An adhesive sheet roll for wafer processing was prepared in the same manner as in example 1.

Example 3

(Preparation of Laminated Film)
A heated and dissolved ethylene-vinyl acetate copolymer was extruded from a die, and formed into a film. Right after forming, the film was brought into contact with a silicone rubber roll of which arithmetic average roughness (Ra) is 3.5 μm and ten-point average roughness (Rz) is 12 μm, and it was cooled at the same time, and a base film (ethylene-vinyl acetate copolymer, thickness 115 μm) of arithmetic average roughness (Ra) of 1.5 μm and ten-point average roughness (Rz) of 8.3 μm at one side was prepared.

A laminated film was prepared in the same manner as in example 1 except that the base film prepared above was used.

(Preparation of Adhesive Sheet Roll for Wafer Processing)

An adhesive sheet roll for wafer processing was prepared in the same manner as in example 1.

Example 4

(Preparation of Laminated Film)

A laminated film was prepared in the same manner as in example 1 except that a base film (PET, thickness 50 μm) of arithmetic average roughness (Ra) of 0.3 μm and ten-point average roughness (Rz) of 5.0 μm at one side, and a releasing film (PET, thickness 38 μm) of arithmetic average roughness (Ra) of 1.6 μm and ten-point average roughness (Rz) of 15.0 μm at one side preliminarily adjusted by sand blasting were used.

(Preparation of Adhesive Sheet Roll for Wafer Processing)

An adhesive sheet roll for wafer processing was prepared in the same manner as in example 1.

Example 5

(Preparation of Laminated Film)

A laminated film was prepared in the same manner as in example 1 except that a base film (PET, thickness 50 μm) of arithmetic average roughness (Ra) of 0.3 μm and ten-point average roughness (Rz) of 5.0 μm at one side, and a releasing film (PET, thickness 38 μm) of arithmetic average roughness (Ra) of 0.3 μm and ten-point average roughness (Rz) of 5.0 μm at one side were used.

(Preparation of Adhesive Sheet Roll for Wafer Processing)

An adhesive sheet roll for wafer processing was prepared in the same manner as in example 1, except that a set-off film of 230 mm in width (PET, thickness 25 μm, Ra=1.6 μm, Rz=15 μm at both base film side and releasing film side) was inserted between the base film and releasing film at the time of taking up. The take-up length of the adhesive sheet was 100 m.

Example 6

(Preparation of Laminated Film)

A laminated film was prepared in the same manner as in example 5.

(Preparation of Adhesive Sheet Roll for Wafer Processing)

An adhesive sheet roll for wafer processing was prepared in the same manner as in example 5, except that a set-off film of 230 mm in width (PET, thickness 25 μm, Ra=1.6 μm, Rz=15 μm at base film side and Ra=0.3 μm, Rz=5.0 μm at releasing film side) was used. The take-up length of the adhesive sheet was 100 m.

Example 7

(Preparation of Laminated Film)

A laminated film was prepared in the same manner as in example 5.

(Preparation of Adhesive Sheet Roll for Wafer Processing)

An adhesive sheet roll for wafer processing was prepared in the same manner as in example 5, except that a set-off film of 230 mm in width (PET, thickness 25 μm, Ra=0.3 μm, Rz=5.0 μm at base film side and Ra=1.6 μm, Rz=15 μm at releasing film side) was used. The take-up length of the adhesive sheet was 100 m.

Comparative Example 1

(Preparation of Laminated Film)

A laminated film was prepared in the same manner as in example 1, except that a base film (PET, thickness 50 μm) of arithmetic average roughness (Ra) of 0.3 μm and ten-point average roughness (Rz) of 5.0 μm at one side was used.

(Preparation of Adhesive Sheet Roll for Wafer Processing)

An adhesive sheet roll for wafer processing was prepared in the same manner as in example 1.

Comparative Example 2

(Preparation of Laminated Film)

A laminated film was prepared in the same manner as in example 2, except that a base film (PET, thickness 50 μm) of arithmetic average roughness (Ra) of 0.5 μm and ten-point average roughness (Rz) of 6.5 μm at one side was used.

(Preparation of Adhesive Sheet Roll for Wafer Processing)

An adhesive sheet roll for wafer processing was prepared in the same manner as in example 1.

Comparative Example 3

(Preparation of Laminated Film)

A laminated film was prepared in the same manner as in example 1, except that a base film (ethylene-vinyl acetate copolymer, thickness 115 μm) of arithmetic average roughness (Ra) of 0.4 μm and ten-point average roughness (Rz) of 7.8 μm at one side was used.

(Preparation of Adhesive Sheet Roll for Wafer Processing)

An adhesive sheet roll for wafer processing was prepared in the same manner as in example 1.

Comparative Example 4

(Preparation of Laminated Film)

A laminated film was prepared in the same manner as in example 1, except that 2,6-di-t-butyl hydroxy toluene (BHT) was added until the total concentration of the polymerization inhibitor in the solid content of the adhesive composition became 1000 ppm, and that a base film (PET, thickness 50 μm) of arithmetic average roughness (Ra) of 0.3 μm and ten-point average roughness (Rz) of 5.0 μm at one side was used.

(Preparation of Adhesive Sheet Roll for Wafer Processing)

An adhesive sheet roll for wafer processing was prepared in the same manner as in example 1.

Comparative Example 5

(Preparation of Laminated Film)

A laminated film was prepared in the same manner as in example 1, except that 2,6-di-t-butyl hydroxy toluene (BHT) was added until the total concentration of the polymerization inhibitor in the solid content of the adhesive composition became 10000 ppm, and that a base film (PET, thickness 50

μm) of arithmetic average roughness (Ra) of 0.3 μm and ten-point average roughness (Rz) of 5.0 μm at one side was used.

(Preparation of Adhesive Sheet Roll for Wafer Processing)

An adhesive sheet roll for wafer processing was prepared in the same manner as in example 1.

Comparative Example 6

(Preparation of Laminated Film)

A laminated film was prepared in the same manner as in example 5.

(Preparation of Adhesive Sheet Roll for Wafer Processing)

An adhesive sheet roll for wafer processing was prepared in the same manner as in example 5, except that a set-off film of 230 mm in width (PET, thickness 25 μm, Ra=0.3 μm, Rz=5.0 μm at both base film side and releasing film side) was used. The take-up length of the adhesive sheet was 100 m.

As clear from Table 1, when surface of base film or releasing film are rough (examples 1 to 4), the decline of adhesive force after storage is small. This is because the radical polymerization reaction of the adhesive layer is suppressed. After exposure to ultraviolet ray, the adhesive force is sufficiently lowered. On the other hand, if the surface is not rough in the base film and releasing film (comparative examples 1 to 3), the decline of adhesive force after storage is large. This is because the radical polymerization reaction of the adhesive layer is progressed during storage. If the content of the polymerization inhibitor in the adhesive layer is excessive (comparative examples 4, 5), the decline of adhesive force after storage is suppressed, but the decline of adhesive force by exposure to ultraviolet ray is extremely impeded.

If the surface of the set-off film is rough (examples 5 to 7), the adhesive force is hardly lowered after storage. This is because the radical polymerization reaction of the adhesive layer is suppressed. After exposure to ultraviolet ray, the adhesive force is sufficiently lowered. On the other hand, if the surface is not rough in the set-off film (comparative example 6), the decline of adhesive force after storage is large. This is because the radical polymerization reaction of the adhesive layer is progressed during storage.

What is claimed is:

1. An adhesive sheet roll for wafer processing comprising a base film, radiation curing type adhesive layer, and releasing film in this sequence, wherein the arithmetic average roughness (Ra) of the other surface of the side of the base film and/or releasing film contacting with the radiation curing type adhesive layer is 1 μm or more, wherein the radiation curing type adhesive layer comprises a radical polymerization inhibitor, and wherein the weight of the radical polymerization inhibitor contained in the radiation curing type adhesive layer is more than 10 ppm and less than 1000 ppm, wherein the ten-point average roughness (Rz) of the other surface of the side of the base film and/or releasing film contacting with the radiation curing type adhesive layer is 12 μm or more, and wherein the adhesive sheet roll is configured to suppress radical polymerization chain reaction during storage of the adhesive sheet roll.

2. An adhesive sheet for wafer processing prepared by cutting the adhesive sheet roll for wafer processing in claim 1, according to the shape of a semiconductor wafer.

3. A manufacturing method of semiconductor device characterized by processing the semiconductor wafer in a state of the radiation curing type adhesive layer of the adhesive sheet for wafer processing of claim 2 being adhered to the semiconductor wafer.

4. A semiconductor device manufactured in the method of claim 3.

TABLE 1

| | Content of the polymerization inhibitor in the adhesive layer (ppm) | Surface of roughness | | | | | | | | Adhesive force (N/20 mm tape width) | | | |
|---|---|---|---|---|---|---|---|---|---|---|---|---|---|
| | | Base film | | Releasing film | | Set-off film | | | | Before storage | After exposure to ultraviolet ray (before storage) | After storage | After exposure to ultraviolet ray (after storage) |
| | | Ra (μm) | Rz (μm) | Ra (μm) | Rz (μm) | At base film | | At releasing film | | | | | |
| | | | | | | Ra(μm) | Rz(μm) | Ra(μm) | Rz(μm) | | | | |
| Example 1 | 100 | 1.6 | 15 | 0.3 | 5 | — | — | — | — | 3.3 | 0.2 | 3.3 | 0.2 |
| Example 2 | 500 | 2.6 | 16 | 0.3 | 5 | — | — | — | — | 5.1 | 0.15 | 5.2 | 0.16 |
| Example 3 | 100 | 1.5 | 8.3 | 0.3 | 5 | — | — | — | — | 4.5 | 0.2 | 4.4 | 0.19 |
| Example 4 | 100 | 0.3 | 5 | 1.6 | 15 | — | — | — | — | 3.2 | 0.2 | 3.1 | 0.2 |
| Example 5 | 100 | 0.3 | 5 | 0.3 | 5 | 1.6 | 15 | 1.6 | 15 | 3.3 | 0.2 | 3.2 | 0.2 |
| Example 6 | 100 | 0.3 | 5 | 0.3 | 5 | 1.6 | 15 | 0.3 | 5 | 3.3 | 0.2 | 3.3 | 0.2 |
| Example 7 | 100 | 0.3 | 5 | 0.3 | 5 | 0.3 | 5 | 1.6 | 15 | 3.3 | 0.2 | 3.4 | 0.2 |
| Comparative Example 1 | 100 | 0.3 | 5 | 0.3 | 5 | — | — | — | — | 3.3 | 0.19 | 0.2 | 0.15 |
| Comparative Example 2 | 500 | 0.5 | 6.5 | 0.3 | 5 | — | — | — | — | 5.1 | 0.15 | 0.14 | 0.13 |
| Comparative Example 3 | 100 | 0.4 | 7.8 | 0.3 | 5 | — | — | — | — | 4.5 | 0.2 | 0.19 | 0.16 |
| Comparative Example 4 | 1000 | 0.3 | 5 | 0.3 | 5 | — | — | — | — | 3.5 | 1.2 | 3.5 | 0.8 |
| Comparative Example 5 | 10000 | 0.3 | 5 | 0.3 | 5 | — | — | — | — | 3.7 | 3.7 | 3.7 | 3.1 |
| Comparative Example 6 | 100 | 0.3 | 5 | 0.3 | 5 | 0.3 | 5 | 0.3 | 5 | 3.3 | 0.2 | 0.22 | 0.19 |

5. A manufacturing method of adhesive sheet with semiconductor wafer comprising a step of adhering a semiconductor wafer to a radiation curing type adhesive layer of the adhesive sheet roll for wafer processing in claim 1, and a step of cuffing the adhesive sheet according to the shape of the semiconductor wafer.

6. An adhesive sheet with semiconductor wafer manufactured in the method of claim 5.

7. A manufacturing method of semiconductor device characterized by processing the semiconductor wafer of the adhesive sheet with semiconductor wafer of claim 6.

8. A semiconductor device manufactured in the method of claim 7.

9. The adhesive sheet roll for wafer processing of claim 1, wherein only base film has an arithmetic average roughness (Ra) that is 1 μm or more.

10. The adhesive sheet roll for wafer processing of claim 1, wherein the arithmetic average roughness (Ra) of the other surface of the side of both the base film and releasing film is 1 μm or more.

11. An adhesive sheet roll for wafer processing which laminates multiple layers of laminated film stacking up base film, radiation curing type adhesive layer, and releasing film in this sequence, wherein a set-off film is laminated on the other side of the base film or releasing film contacting with the radiation curing type adhesive layer, and the arithmetic average roughness (Ra) of the surface of one side or both sides of the set-off film is 1 μm or more, wherein the radiation curing type adhesive layer comprises a radical polymerization inhibitor, and wherein the weight of the radical polymerization inhibitor contained in the radiation curing type adhesive layer is more than 10 ppm and less than 1000 ppm, wherein said set-off film separates the base film of a first layer of the laminated film and the releasing film of a second layer of the laminated film wherein said first and second layers of the laminated film represent adjacent layers of the laminated film when the laminated film is wound in the adhesive sheet roll, wherein the ten-point average roughness (Rz) of one side or both sides of the set-off film is 12 μm or more, and wherein the adhesive sheet roll is configured to suppress radical polymerization chain reaction during storage of the adhesive sheet roll.

12. An adhesive sheet for wafer processing prepared by cutting the adhesive sheet roll for wafer processing in claim 11, according to the shape of a semiconductor wafer.

13. A manufacturing method of semiconductor device characterized by processing the semiconductor wafer in a state of the radiation curing type adhesive layer of the adhesive sheet for wafer processing of claim 12 being adhered to the semiconductor wafer.

14. A manufacturing method of adhesive sheet with semiconductor wafer comprising a step of adhering a semiconductor wafer to a radiation curing type adhesive layer of the adhesive sheet roll for wafer processing in claim 11, and a step of cutting the adhesive sheet according to the shape of the semiconductor wafer.

15. An adhesive sheet with semiconductor wafer manufactured in the method of claim 14.

16. A manufacturing method of semiconductor device characterized by processing the semiconductor wafer of the adhesive sheet with semiconductor wafer of claim 15.

17. A semiconductor device manufactured in the method of claim 16.

18. A roll of an adhesive sheet for wafer processing, wherein an inner surface of the adhesive sheet is in contact with an outer surface of the adhesive sheet, said adhesive sheet being constituted by laminated multiple layers comprising: (i) a base film; (ii) a radiation curing type adhesive layer formed on top of the base film; and (iii) a releasing film formed on top of the adhesive layer, wherein at least one of the inner surface and the outer surface of the adhesive sheet which are in contact with each other has an arithmetic average roughness (Ra) of 1 μm or higher to form an air layer therebetween, and the radiation curing type adhesive layer contains a radical polymerization inhibitor in an amount of less than 1000 ppm by weights, wherein the at least one of the inner surface and the outer surface of the adhesive sheet has a ten-point average roughness (Rz) of 12 μm or higher, and wherein the adhesive sheet roll is configured to suppress radical polymerization chain reaction during storage of the adhesive sheet roll.

19. The roll according to claim 18, wherein the inner surface is a surface of the releasing film opposite to the adhesive layer, and the outer surface is a surface of the base film opposite to the adhesive layer.

20. The roll according to claim 18, wherein the laminated multiple layers further comprise a set-off film formed on top of the release film, wherein the inner surface is a surface of the set-off film opposite to the release film, and the outer surface is a surface of the base film opposite to the adhesive layer, and wherein the base film, the adhesive layer, and the release film are transparent, wherein said set-off film separates the base film of a first layer of the adhesive sheet and the releasing film of a second layer of the adhesive sheet wherein said first and second layers of the adhesive sheet represent adjacent layers of the adhesive sheet when the adhesive sheet is wound in the roll of adhesive sheet.

21. The roll according to claim 18, wherein the amount of radical polymerization inhibitor is more than 10 ppm.

\* \* \* \* \*

UNITED STATES PATENT AND TRADEMARK OFFICE
CERTIFICATE OF CORRECTION

PATENT NO. : 7,479,317 B2
APPLICATION NO. : 11/054826
DATED : January 20, 2009
INVENTOR(S) : Kouichi Hashimoto et al.

It is certified that error appears in the above-identified patent and that said Letters Patent is hereby corrected as shown below:

At Column 17, Line 5, in Claim 5, please delete "cuffing" and insert --cutting--, therefor.

At Column 18, Line 25, in Claim 18, please delete "weights," and insert --weight,--, therefor.

Signed and Sealed this

Sixteenth Day of March, 2010

David J. Kappos
*Director of the United States Patent and Trademark Office*